United States Patent
Miki

(10) Patent No.: US 7,095,672 B2
(45) Date of Patent: Aug. 22, 2006

(54) SEMICONDUCTOR MEMORY DEVICE AND METHOD OF CONTROLLING THE SAME

(75) Inventor: Atsunori Miki, Tokyo (JP)

(73) Assignee: NEC Corporation, (JP)

( * ) Notice: Subject to any disclaimer, the term of this patent is extended or adjusted under 35 U.S.C. 154(b) by 0 days.

(21) Appl. No.: 10/852,288

(22) Filed: May 25, 2004

(65) Prior Publication Data
US 2005/0002238 A1    Jan. 6, 2005

(30) Foreign Application Priority Data
May 28, 2003    (JP)    ............................ 2003-150747

(51) Int. Cl.
  *G11C 8/00*    (2006.01)
(52) U.S. Cl. .............................. 365/230.03; 365/230.06
(58) Field of Classification Search ........... 365/230.03, 365/230.06
  See application file for complete search history.

(56) References Cited

U.S. PATENT DOCUMENTS

| 5,485,595 A | 1/1996 | Assar et al. |
| 5,768,194 A * | 6/1998 | Matsubara et al. .... 365/185.33 |
| 5,920,501 A * | 7/1999 | Norman ................. 365/185.02 |
| 5,930,193 A | 7/1999 | Achiwa et al. |
| 5,963,474 A | 10/1999 | Uno et al. |
| 6,055,335 A * | 4/2000 | Ida et al. .................... 382/232 |
| 6,167,483 A | 12/2000 | Miyauchi |
| 6,643,187 B1 * | 11/2003 | Mokhlesi ............... 365/185.33 |
| 2002/0024088 A1 | 2/2002 | Takai |

FOREIGN PATENT DOCUMENTS

| JP | 4-125898 | 4/1992 |
| JP | 2001-14865 A1 | 1/2001 |

* cited by examiner

*Primary Examiner*—Michael Tran
(74) *Attorney, Agent, or Firm*—Dickstein, Shapiro, Morin & Oshinsky, LLP.

(57) ABSTRACT

A semiconductor memory device includes a plurality of memory blocks formed of a flash memory. The semiconductor memory device further includes a rewriting monitor circuit for memorizing the number of times of data rewriting in each of the memory blocks, and a switching circuit for switching a memory block selection address. When the number of times of rewriting in a first memory block which is a rewriting request object exceeds a predetermined value, data in a second memory block is transferred to the first memory block. Data to be written is written to the second memory block. Therefore, it is possible to increase the number of times of rewriting in the flash memory.

9 Claims, 14 Drawing Sheets

SEMICONDUCTOR MEMORY DEVICE AND METHOD OF CONTROLLING THE SAME

BACKGROUND OF THE INVENTION

1. Field of the Invention

The present invention relates to a nonvolatile semiconductor memory device having a plurality of rewritable memory blocks, and a method of controlling the same.

2. Description of the Related Art

In recent years, a flash memory that is a writable nonvolatile memory has been universally used. The flash memory is capable of retaining memory contents without being supplied with a power source. However, if erasing and writing are performed on the flash memory many times, its characteristic is deteriorated. For this reason, the number of times of data rewriting in the flash memory is limited.

Thus, there have been various proposals for enhancing reliability of the flash memory. For example, Japanese Patent Laid-Open Publication No. 2001-14865 discloses a flash memory including a rewriting number monitor. This monitor issues an alarm when the number of times of data rewriting in the flash memory exceeds a set value. Japanese Patent Laid-Open Publication No. 1992 (Hei 4)-125898 discloses an access counter for counting the number of times of access to a nonvolatile memory. When the number of times of counting reaches a predetermined value, an object to be accessed is switched to a different memory region.

However, in the proposed flash memory described above, the different memory region needs to be prepared in advance. The flash memory comprising such a memory region requires a large chip area.

SUMMARY OF THE INVENTION

According to the present invention, an erasable semiconductor memory device comprises a data memory unit having a plurality of memory blocks; a rewriting monitor circuit for memorizing the number of times of data rewriting in each of the memory blocks; and a block address switching circuit for switching a block selection address. Furthermore, the memory device comprises a temporary memory circuit for temporarily retaining data memorized in a predetermined block; and a control unit for controlling a data transfer.

According to another embodiment of the present invention, a method of controlling a semiconductor memory device comprises the steps of:

erasing data in a first memory block based on a rewriting request;

acquiring the number of times of rewriting in each memory block;

writing, to a temporary memory circuit, data in a second memory block in which the number of times of rewriting is equal to a predetermined value or less, when the number of times of rewriting in the first memory block, in which the data is erased, exceeds the predetermined value;

erasing the data in the second memory block;

changing a memory block address to memorize it;

transferring the data stored in the temporary memory circuit to the first memory block; and writing data to be rewritten to the second memory block.

The above described method can include the step of increasing the number of times of rewriting in a memory block by one while erasing data in the memory block and memorizing the number of times of rewriting therein.

The semiconductor memory device and the controlling method according to the present invention can increase the number of times of rewriting without increasing a nonvolatile memory region.

BRIEF DESCRIPTION OF THE DRAWINGS

The above and other objects, features and advantages of the present invention will become apparent from the following detailed description when taken with the accompanying drawings in which.

DETAILED DESCRIPTION OF THE PREFERRED EMBODIMENTS

Figure 1:
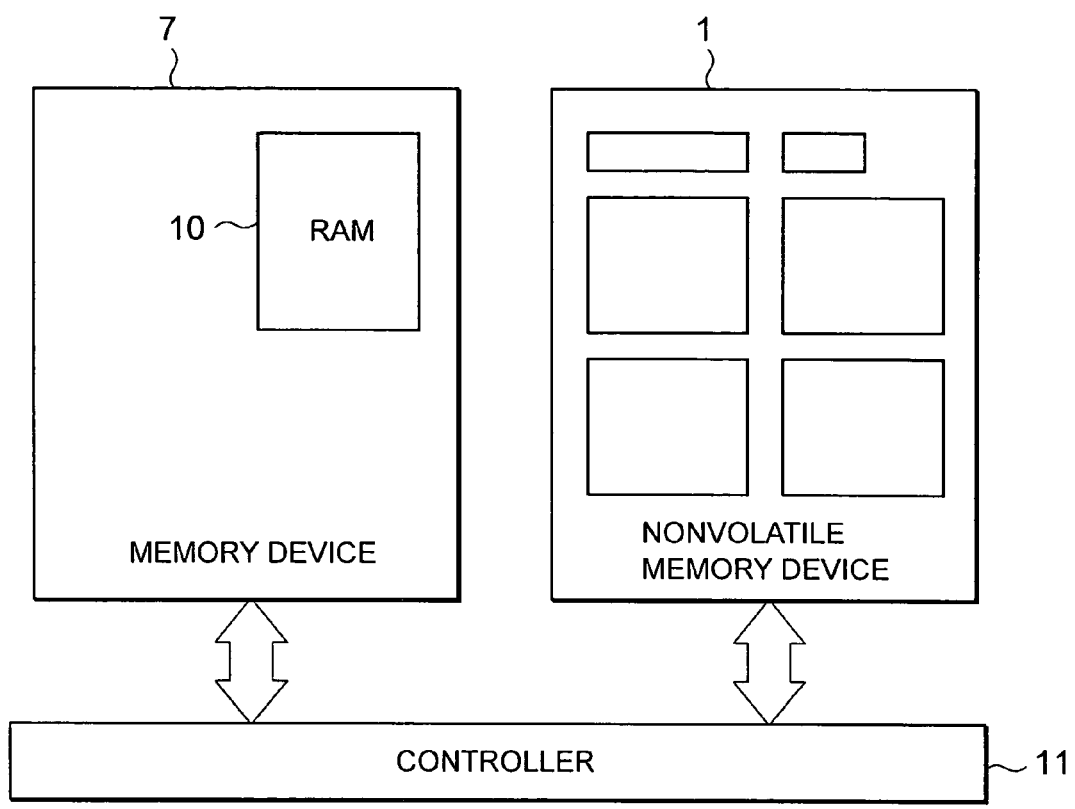
FIG. 1 is a block diagram of a semiconductor memory device of an embodiment of the present invention.

Preferred embodiments of the present invention will be described below. FIG. 1 is a block diagram showing an embodiment of a semiconductor memory device of the present invention. The semiconductor memory device includes a nonvolatile memory device 1 such as a flash memory, a memory device 7, and a controller 11. The memory device 7 has a RAM 10 for temporarily storing data of a memory block in the nonvolatile memory device 1. The controller 11 sends instructions indicating writing, erasing and reading to the nonvolatile memory device 1 and the memory device 7, and controls a data transfer.

Figure 2:
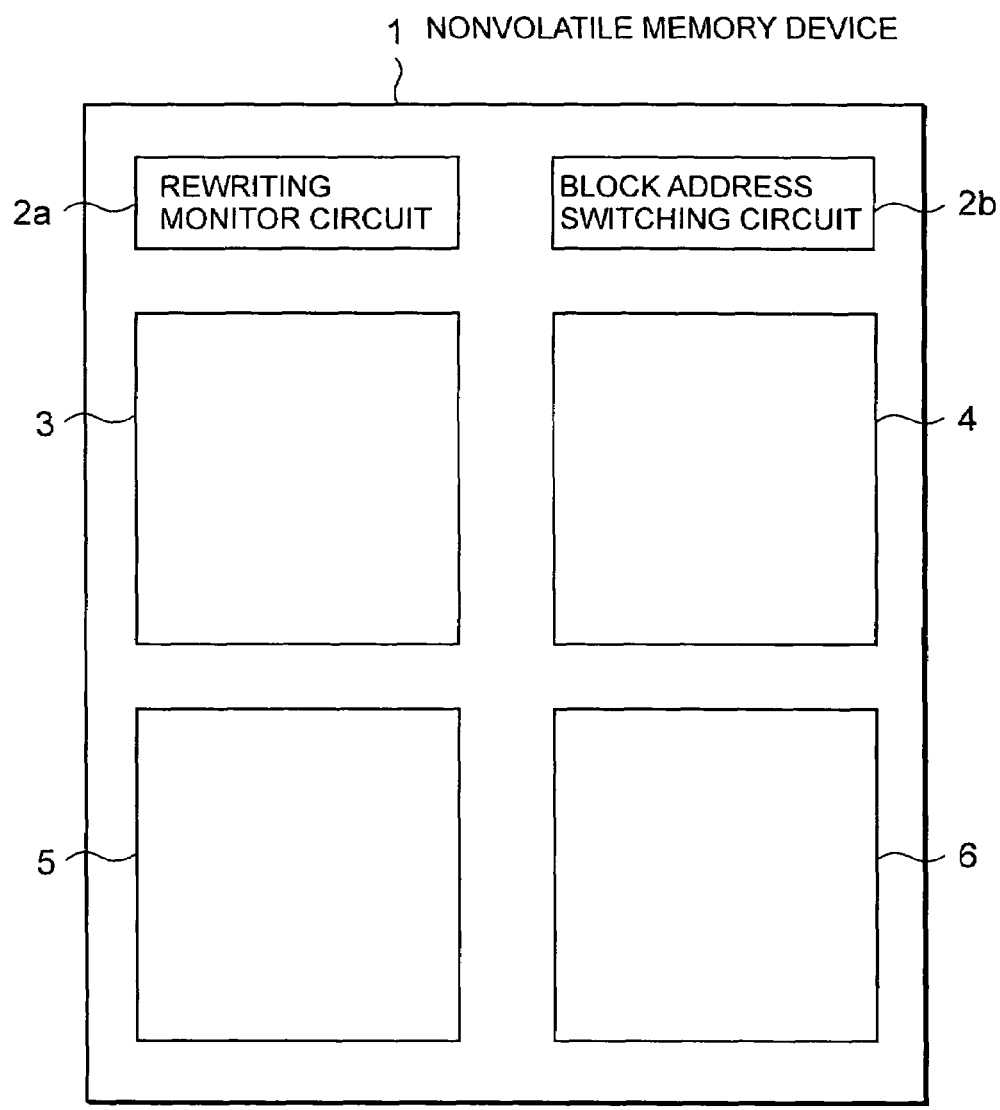
FIG. 2 is a block diagram of a nonvolatile memory device of the embodiment of the present invention.

Referring to FIG. 2, the nonvolatile memory device 1 includes memory blocks 3, 4, 5 and 6, a rewriting monitor circuit 2a, and a block address switching circuit 2b. The rewriting monitor circuit 2a memorizes the number of times of data rewriting in each memory block. The block address switching circuit 2b switches a block selection address inputted from the outside.

Figure 3:
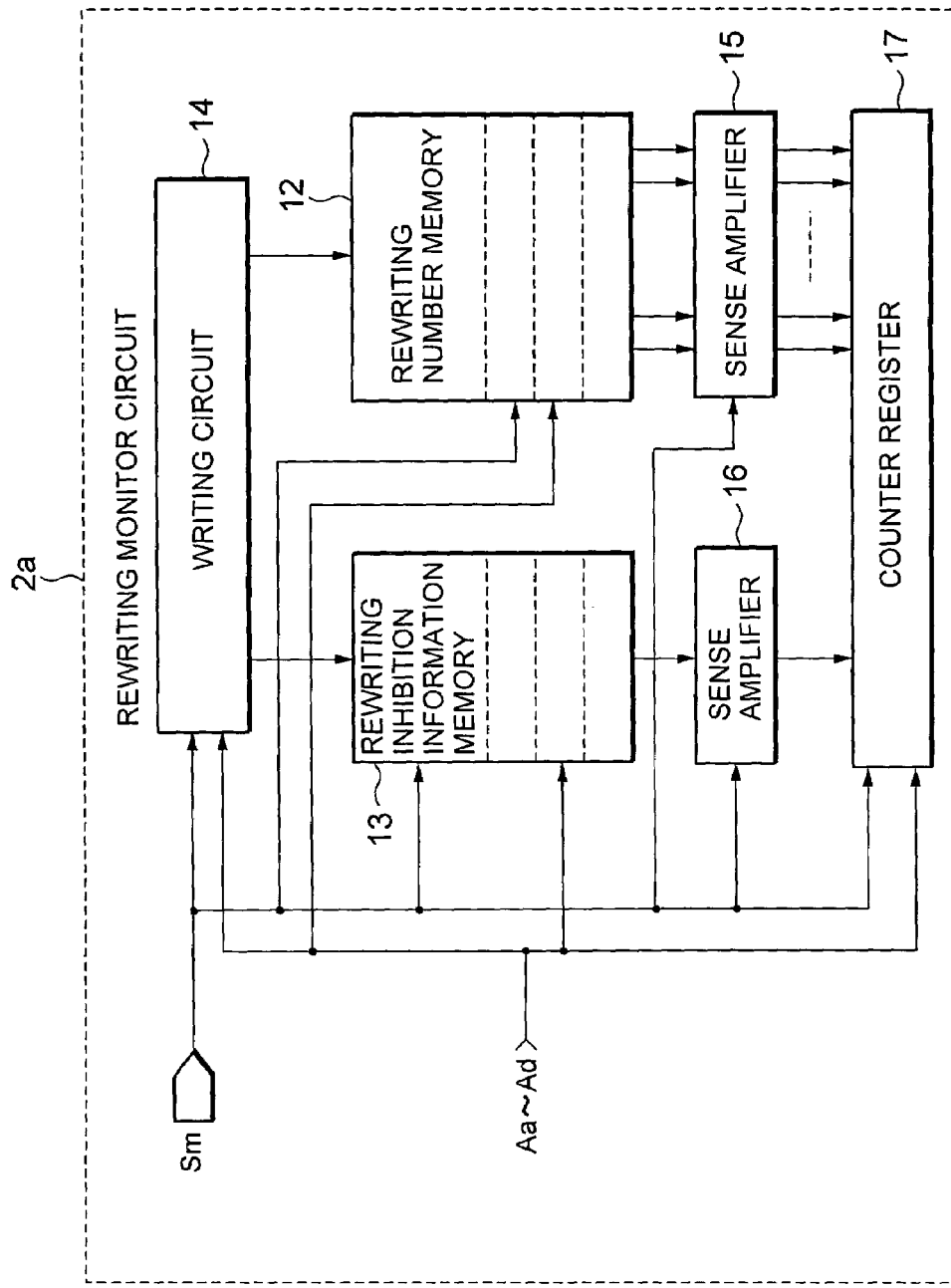
FIG. 3 is a block diagram of an embodiment of a rewriting monitor circuit included in the semiconductor device of the present invention.

Referring to FIG. 3, the rewriting monitor circuit 2a has a rewriting number memory 12 and a rewriting inhibition information memory 13. The rewriting number memory 12 memorizes the number of times of data rewriting in each memory block. The rewriting inhibition information memory 13 can memorize a rewriting inhibition bit (or a flag) corresponding to the memory block. The rewriting inhibition bit is given to a memory block in which the number of times of data rewriting has reached a predetermined value, and displays a rewriting inhibition for this memory block. Furthermore, the rewriting monitor circuit 2a has a writing circuit 14, sense amplifiers 15 and 16 which perform a data reading operation, and a counter register 17 which temporarily stores data readout. Both the writing number memory 12 and the rewriting inhibition information memory 13 have four sections each corresponding to the memory blocks 3 to 6. One bit is newly written to each section of the rewriting number memory 12 for one data rewriting. Therefore, the memory 12 requires no erasing operation during a rewriting operation. The number of bits that can be written to each section corresponds to the number of times of data rewriting that can be performed on each memory block. The rewriting number memory 12 and the rewriting inhibition information memory 13 can be formed in a flash memory circuit along with the memory blocks 3 to 6. A signal Sm is an enable signal of the rewriting monitor circuit 2a. Signals Aa to Ad are a four-bit memory block address signal (selection signal). When the semiconductor memory device receives a writing request, a bit for selecting a memory block to be rewritten is in an ON state. At this time, the rewriting number memory 12 increases the number of times of data rewriting by one. Here, the number is a number memorized in a section to be rewritten. Thereafter, a bit for selecting one of other memory blocks becomes an ON state, and the number of times of data rewriting in these memory blocks is read out. A rewriting inhibition bit is read out if it is present.

Figure 4:
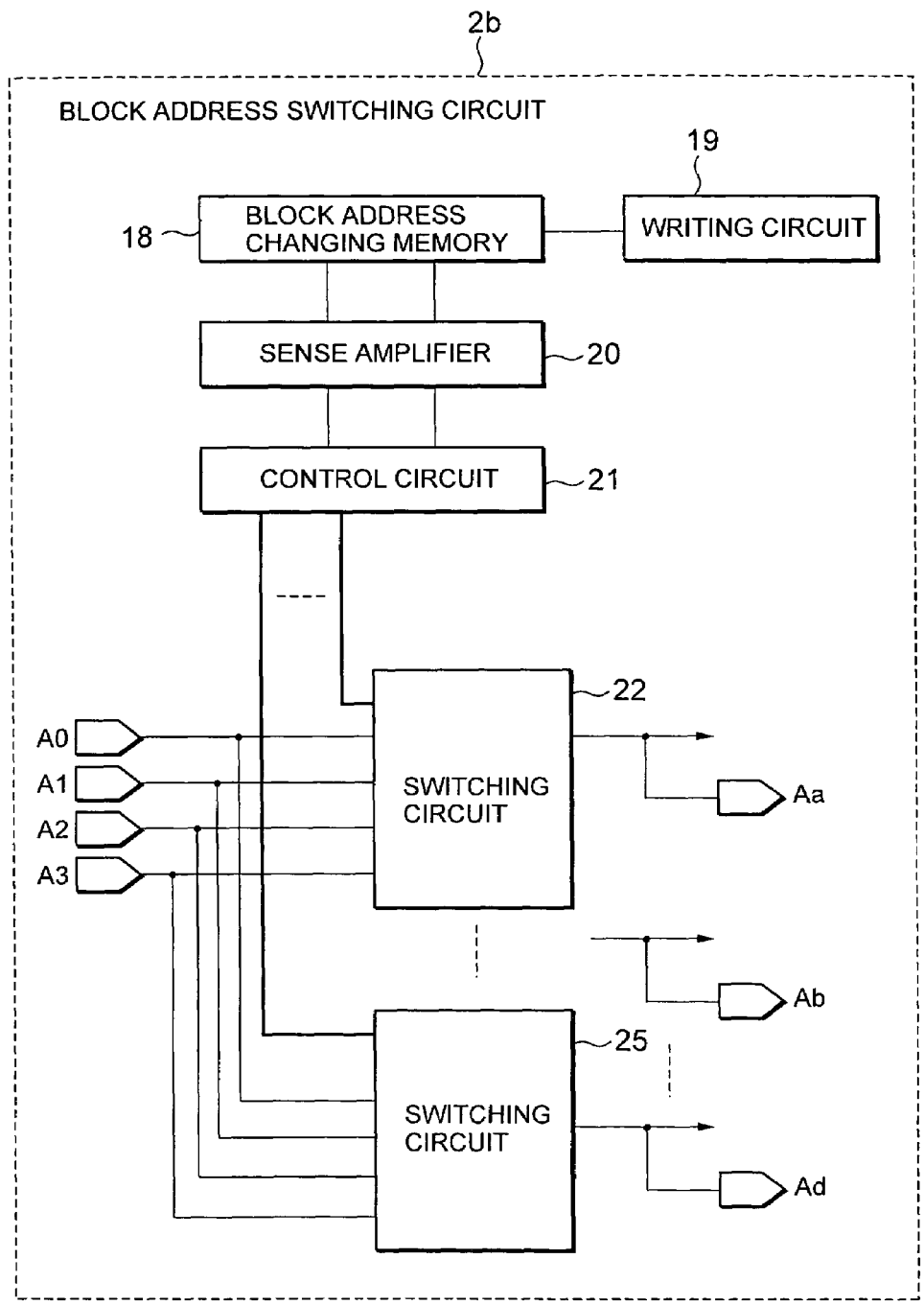
FIG. 4 is a block diagram of an embodiment of a block address switching circuit included in the semiconductor device of the present invention.

Referring to FIG. 4, the block address switching circuit 2b has a block address changing memory 18, a control circuit 21 and switching circuits 22 to 25. The memory 18 stores correspondence information between a block address signal assigned by the controller 11 and each of the memory blocks 3 to 6. The control circuit 21 and the switching circuits 22 to 25 execute a switching operation of the block address based on this correspondence information. Furthermore, the switching circuit 2b has a writing circuit 19, and a sense amplifier 20 which performs reading-out of information. The control circuit 21 supplies a control signal to the switching circuits 22 to 25. Memory block address signals A0 to A3 are inputted to the respective switching circuits from the outside. The memory block addresses A0 to A3 are converted to the memory block addresses (selection signals) Aa to Ad in the semiconductor memory device by the control signal from the control circuit 21. It should be noted that an initial value of the block address changing memory 18 is loaded in a register (or a latch) of the control circuit 21. This initial value is retained until the rewriting of the block address changing memory 18 is performed.

Figure 5:
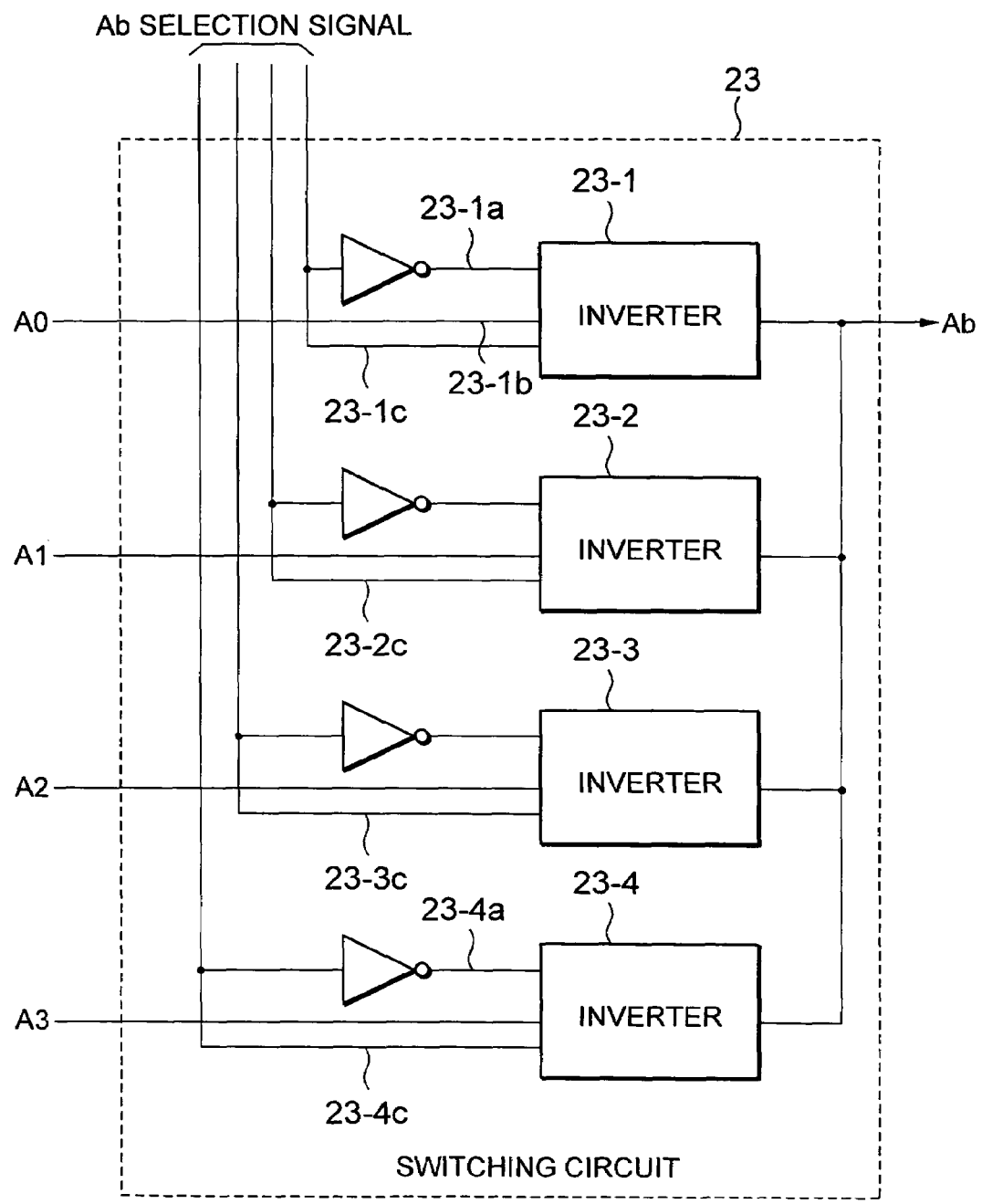
FIG. 5 is a block diagram of an embodiment of a switching circuit.

Referring to FIG. 5, one signal is selected among the block address signals A0 to A3 from the outside in the example of the switching circuit 23. The selected signal corresponds to a signal which is ON (i.e., high level) among the control signals 23-1C to 23-4C. In this example, only the control signal 23-2C is ON (high level), and the memory block address signal Ab is outputted. Other switching circuits perform the same operation.

Figure 6:
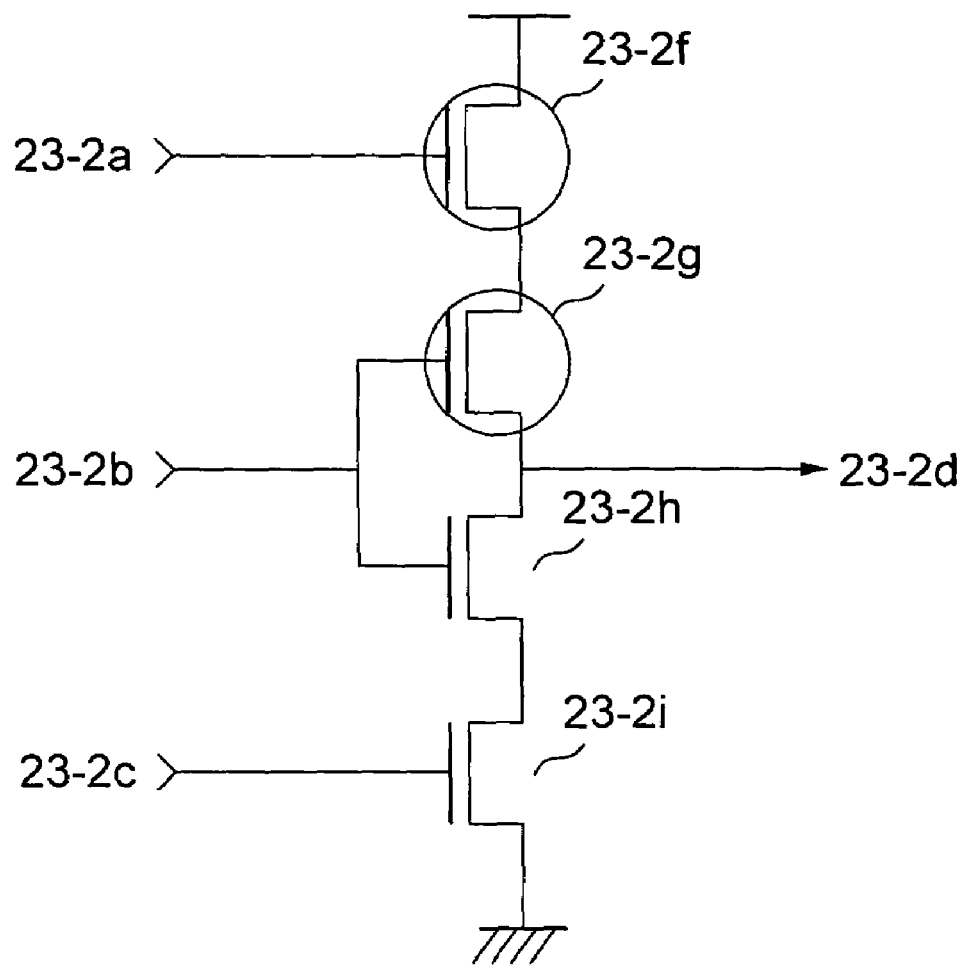
FIG. 6 is a block diagram of an embodiment of an inverter.

Referring to FIG. 6, in an inverter 23-2, the control signal 23-2a is inputted to the gate of a P channel transistor 23-2f, and the control signal 23-2c is inputted to the gate of an N channel transistor 23-2i. An external block address signal A1 (23-2b) is inputted to the gate of a P channel transistor 23-2g and the gate of an N channel transistor 23-2h. Only when the control signal 23-2c is at a high level and the block address signal A1 (23-2b) from the outside is at a high level, an output signal 23-2d becomes low in level (active). In the inverters 23-1, 23-3 and 23-4, since signals corresponding to the control signals 23-2a to 23-2c are at high and low levels, respectively, outputs from these inverters are in an open state.

Figure 7A:
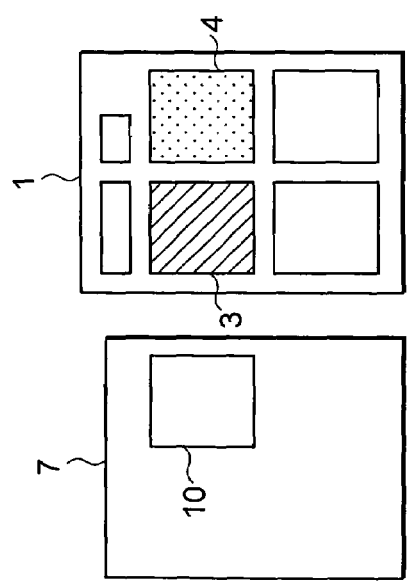
FIGS. 7A, 7B, 7C and 7D show an example of a data transfer in the semiconductor memory device.
Figure 7B:
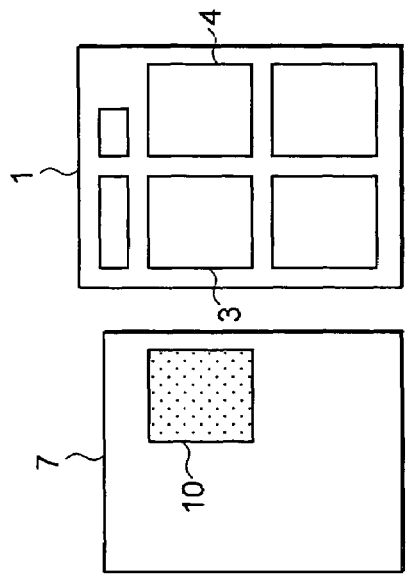
Figure 7C:
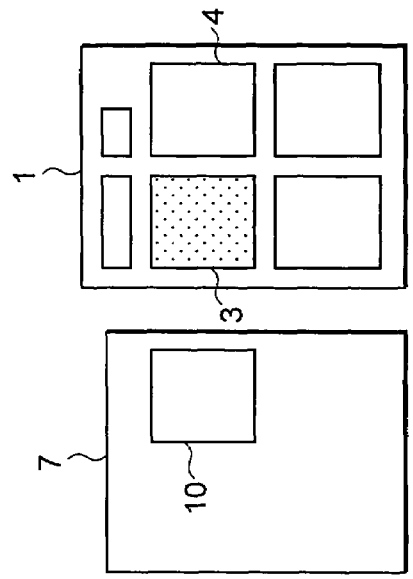
Figure 7D:
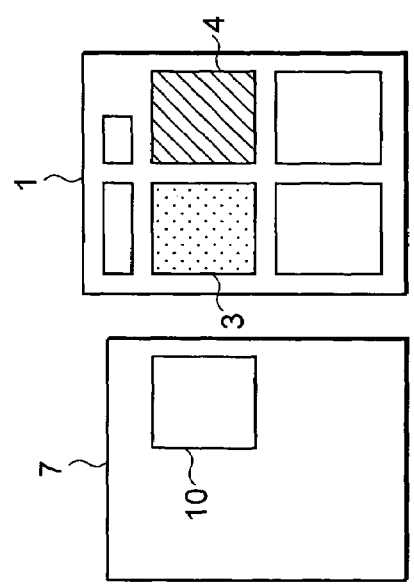

A preferred example of a data transfer process of the semiconductor memory device of the present invention is described in accordance with FIGS. 7A to 7D. Referring to FIG. 7A, the respective memory blocks 3 and 4 in the nonvolatile memory device 1 store data. The memory device 7 has the RAM 10. In this example, the number of times of data rewriting in the memory block 3 shall reach a predetermined limit value. Receiving a rewriting instruction for the memory block 3, the controller 11 first erases the data in the memory block 3. Next, as shown in FIG. 7B, the data in the memory block 4 in which the number of times of data rewriting is smallest is transferred to the RAM 10. The data in the memory block 4 is erased. Thereafter, the controller 11 transfers the data in the RAM 11 to the memory block 3 (as shown in FIG. 7C). After the transfer, in the memory block 4, the controller 11 stores data to be stored in the memory block 3 according to the initial rewriting instruction (as shown in FIG. 7D). As described above, when the controller 11 receives a request to rewrite the memory block 3 in which the number of times of data rewriting has reached the limit, the controller 11 can store the data to be stored in the memory block 3 in the memory block 4 in which the number of times of data rewriting is smallest. The memory block 4 needs not necessarily be one in which the number of times of data rewriting is smallest.

Figure 8:
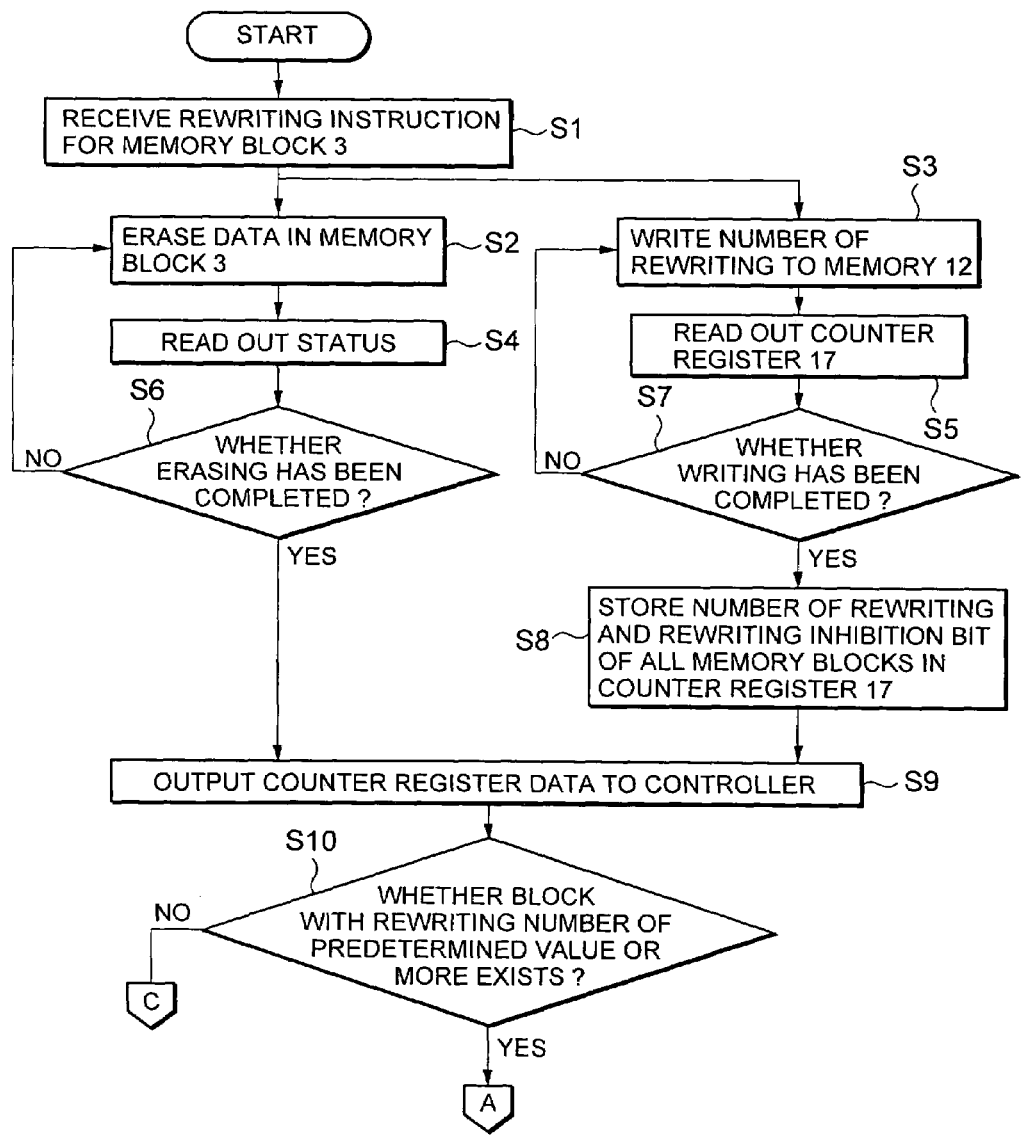
FIG. 8 is a flowchart showing an example of an operation of the semiconductor memory device of the present invention.

Based on FIGS. 8 to 11, a detailed example of the operation of the semiconductor memory device of the present invention will be described. Referring to FIG. 8, the controller 11 receives an instruction for the data rewriting for the memory block 3 (S1). The controller 11 erases the data in the memory block 3 (S2), and writes one bit to a section of the memory block 3 of the rewriting number memory 12 (S3). The controller 11 reads a status of the memory block 3 (S4), and reads the counter register 17 (S5). Writing to the rewriting number memory 12 is to add one bit for each rewriting. The number of times of rewriting in all memory blocks and the rewriting inhibition bit thereof are stored in the counter register 17 (S8). A time required for data erasing in the memory block 3 is generally several milliseconds. However, a time required for data writing to the rewriting number memory 12, which is executed during the data erasing, is several microseconds.

When the data erasing in the memory block 3 is completed (S6), the controller 11 reads the counter register of all blocks (S9). The controller 11 confirms whether or not a memory block in which the number of times of rewriting exceeds a predetermined value exists (S10). The predetermined value can be set through the controller 11.

Figure 9:
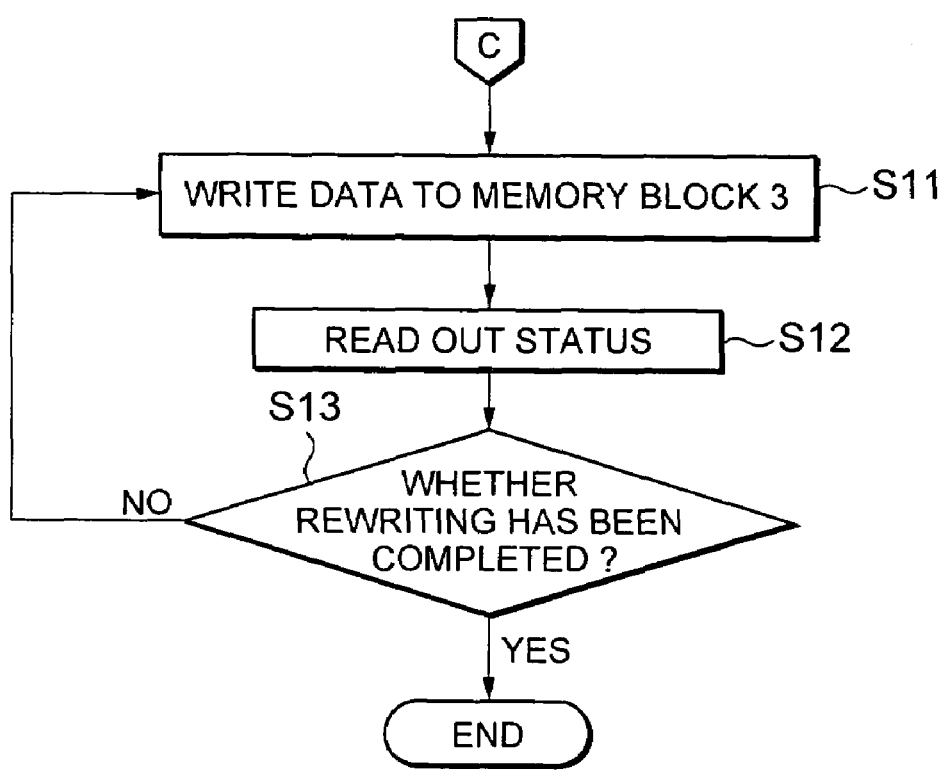
FIG. 9 is a flowchart showing an example of an operation of the semiconductor memory device of the present invention.

When the number of times of rewriting in the memory block 3 is the predetermined value or less (C in FIG. 8), the processing shown in FIG. 9 is executed. First, data is written to the memory block 3 according to the writing instruction (S11). The status of the memory block 3 is confirmed (S12), and the rewriting is completed (S13).

Figure 10:
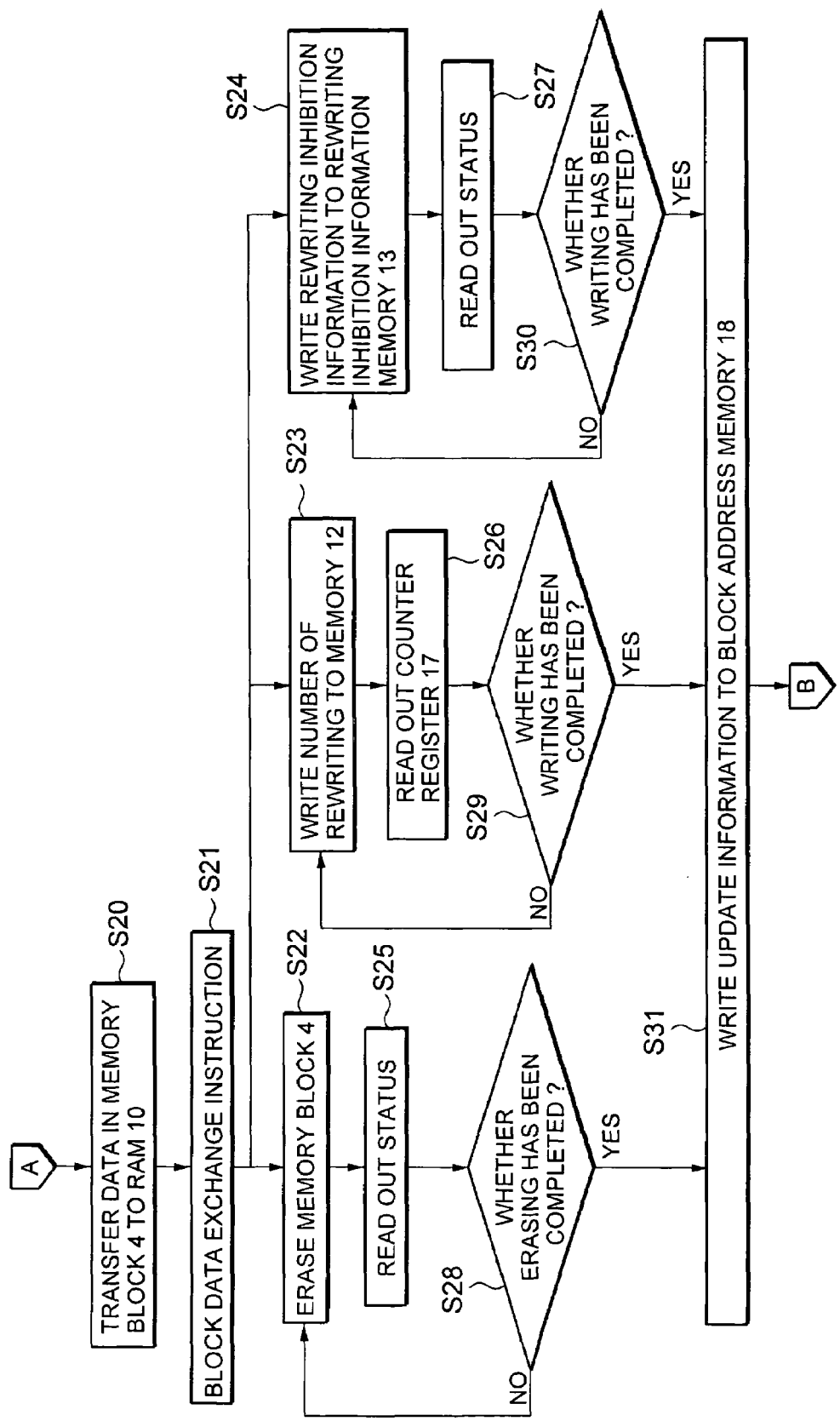
FIG. 10 is a flowchart showing an example of an operation of the semiconductor memory device of the present invention.

When the number of times of rewriting in the memory block 3 exceeds the predetermined value (A in FIG. 8), the processing shown in FIG. 10 is executed. The controller 11 assigns the memory block 4 in which the rewriting inhibition bit is OFF and the number of times of rewriting is smallest. The controller 11 transfers the data in the memory block 4 to the RAM 10 to allow the RAM 10 to temporarily store the data therein (S20). In accordance with the memory block data exchange instruction (S21), the data in the memory block 4 is erased (S22). When the erasing is started, one bit is added to a section of the memory block 4 of the rewriting number memory 12 (S23). Furthermore, a rewriting inhibition bit is given to a section of the memory block 3 of the rewriting inhibition information memory 13 (S24). Irrespective of the number of times of rewriting, in a memory block in which the data exchange should be inhibited, the rewriting inhibition bit can be given to the rewriting inhibition information memory 13. The writing to the rewriting number memory 12 and the writing to the rewiring inhibition information memory 13 are completed during the data erasing in the memory block 4. The status and the counter register are read out (S25 to S27). When the above described data erasing and the bit writing are completed, update information is written to the block address changing memory 18 (S31). The correspondence information after the update is stored in the register or the latch of the control circuit 21. As described above, the block address switching circuit 2b saves the change of the internal memory block address. Therefore, the change of the address of the memory block is not necessary for the controller 11 or an access requestor to perform.

Figure 11:
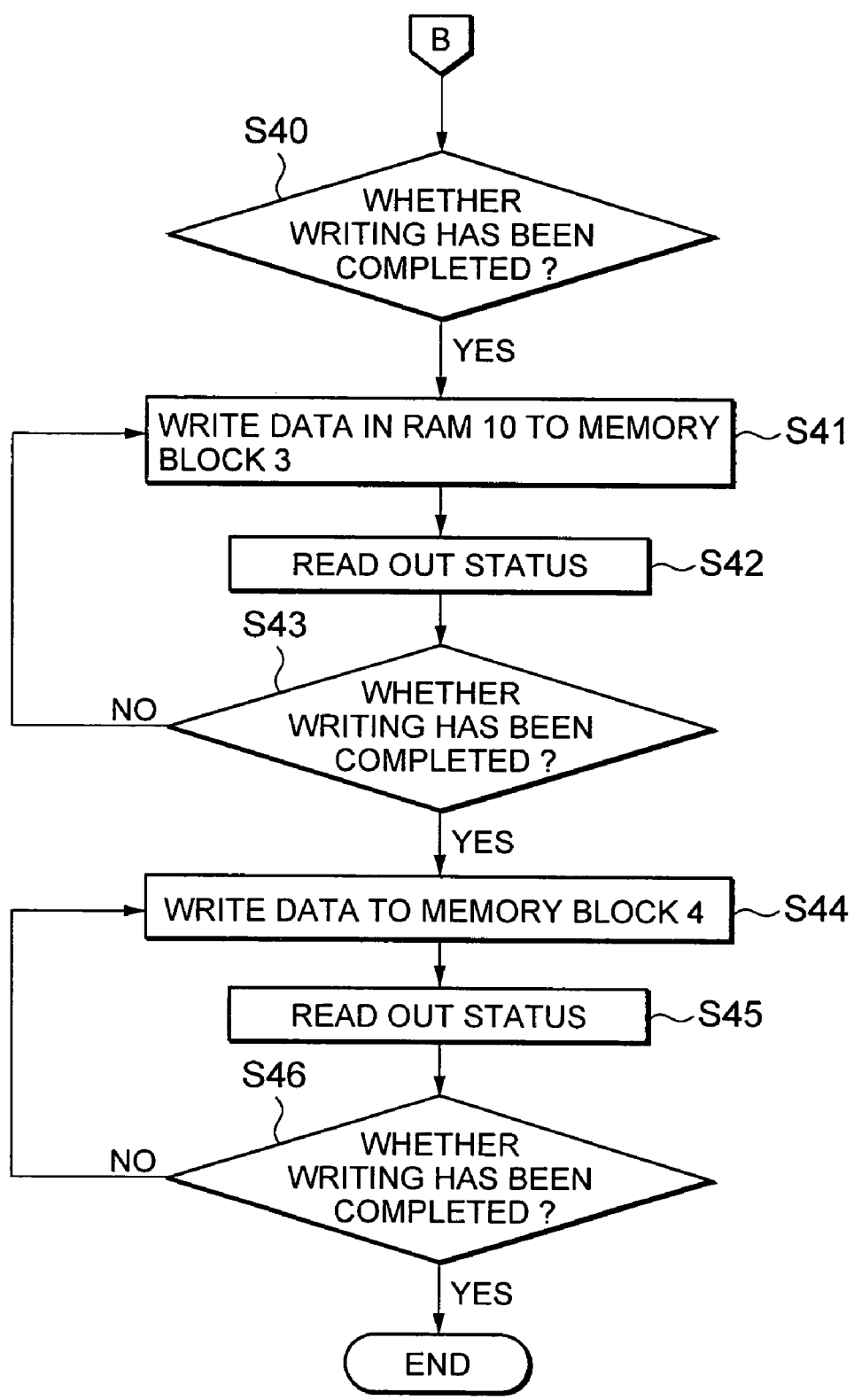
FIG. 11 is a flowchart showing an example of an operation of the semiconductor memory device of the present invention.

Referring to FIG. 11, after the completion of the writing (S40), the controller 11 writes the data stored in the RAM 10 to the memory block 3 (S41). After the completion of the writing (S43), the controller 11 writes data to be written to the memory block 3 to the memory block 4 in which the number of times of rewriting is smallest (S44). At this time, based on the correspondence information stored in the block address changing memory 18, the address of the memory block 3 and the address of the memory block 4 are exchanged. Accordingly, the controller 11 can transmit the same memory block address as the previous memory block address for the data writing.

Figure 12:
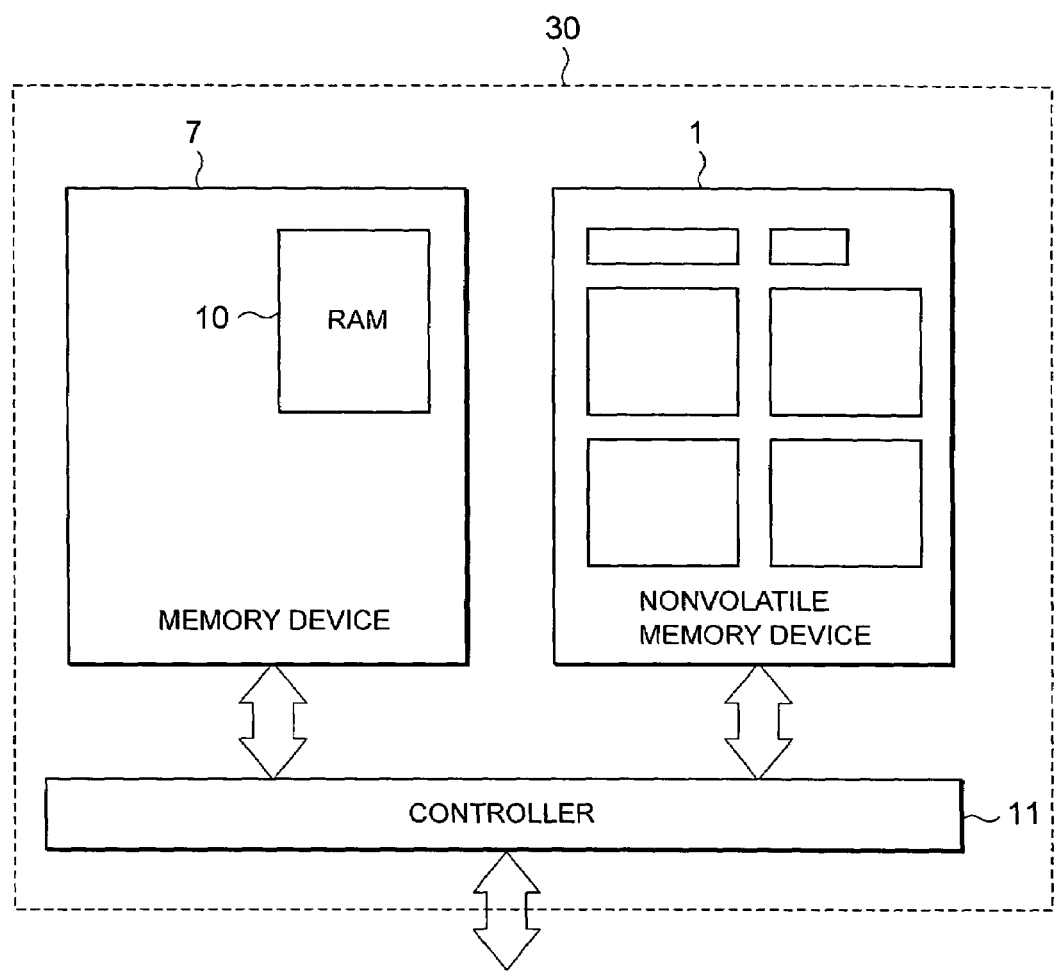
FIG. 12 is a block diagram of another embodiment of the semiconductor memory device of the present invention.
Figure 13:
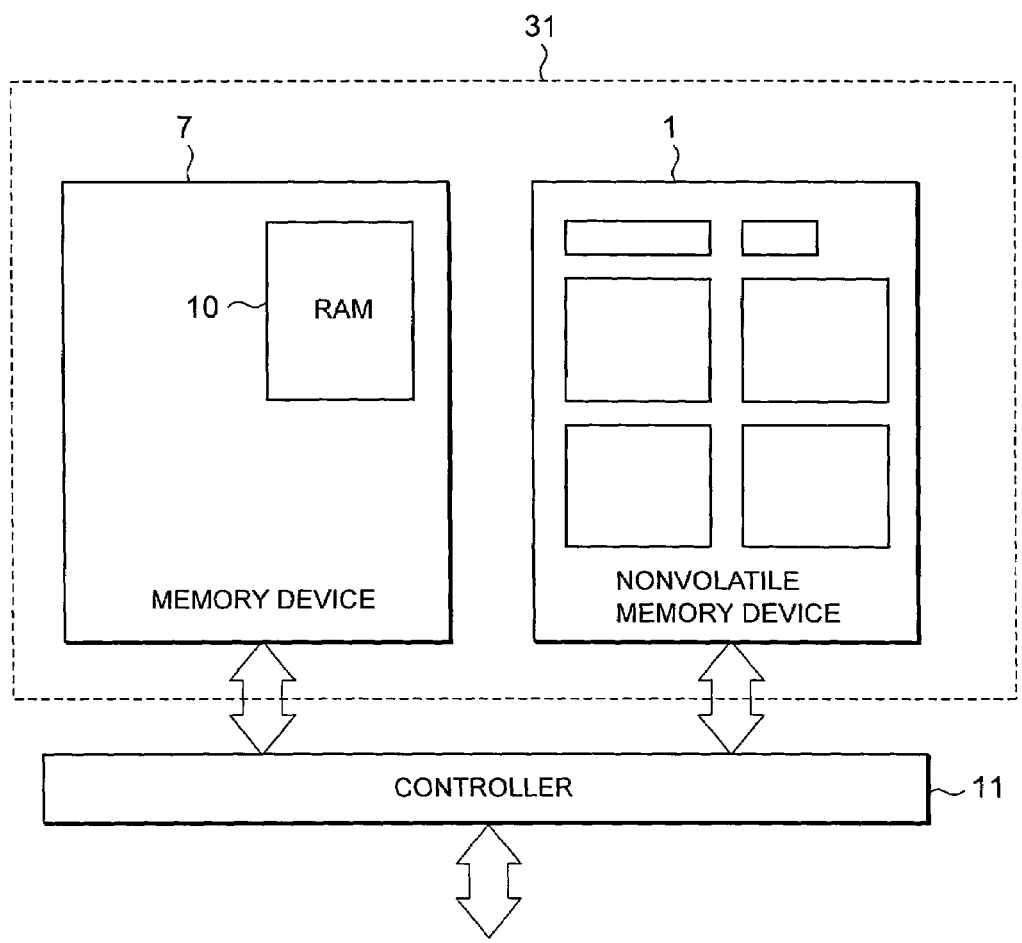
FIG. 13 is a block diagram of another embodiment of the semiconductor memory device of the present invention.
Figure 14:
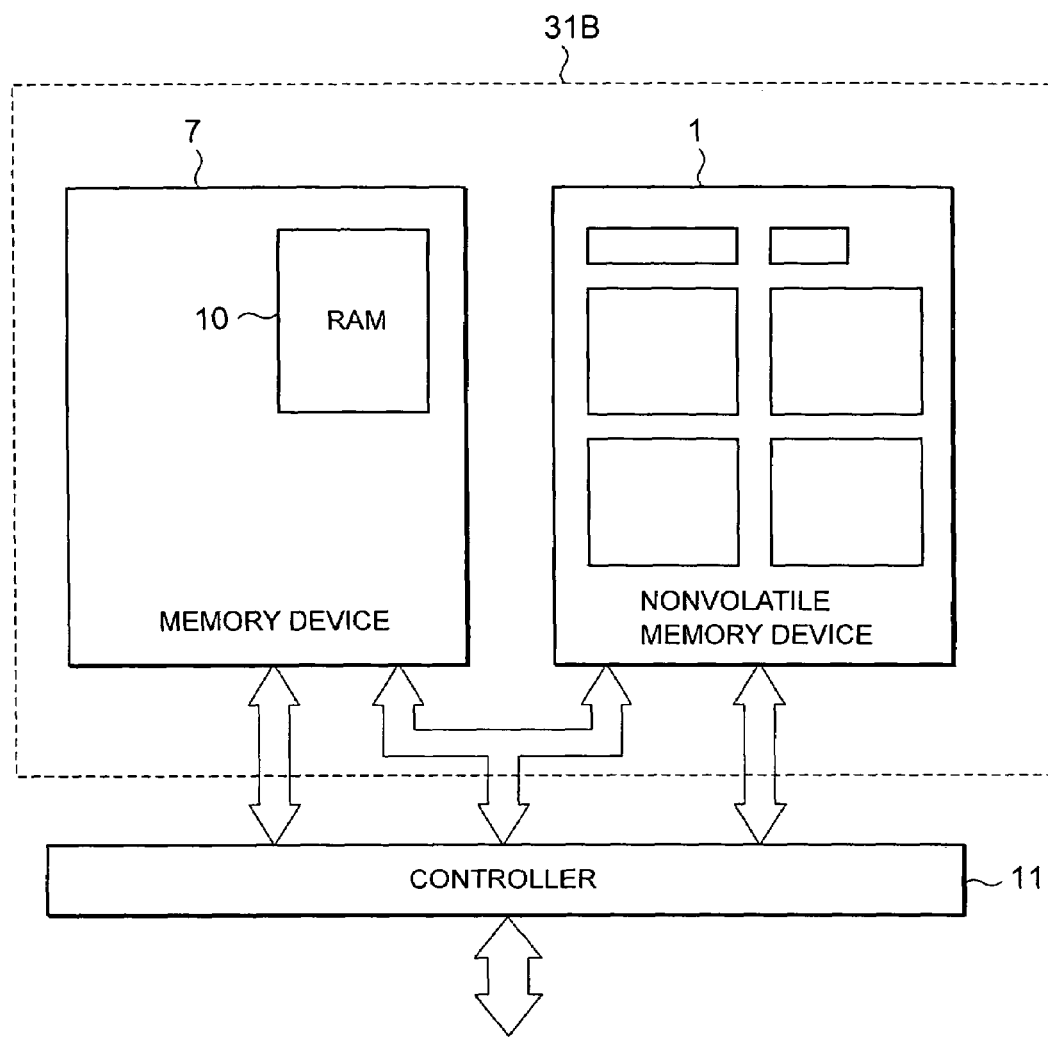
FIG. 14 is a block diagram of another embodiment of the semiconductor memory device of the present invention.

Referring to FIG. 12, a semiconductor memory device 30 of another example of the present invention is formed in one chip including the nonvolatile memory device 1, the memory device 7 and the controller 11. Referring to FIG. 13, a semiconductor memory device 31 of still another embodiment of the present invention is formed of one chip including the nonvolatile memory device 1 and the memory device 7. At this time, the controller 11 can be formed in a separate controller and a processor, or the controller 11 may be an external dedicated controller. FIG. 14 shows a semiconductor memory device 31B of yet another embodiment of the present invention. In this semiconductor memory device 31B, common data and an address signal are a bus signal. Only a control signal is an individual one-to-one signal.

In the present invention, it is possible to increase the number of times of data rewriting in the flash memory without increasing the nonvolatile memory region.

While the present invention has been described in connection with certain preferred embodiments, it is to be understood that the subject matter encompassed by the present invention is not limited to those specific embodiments. On the contrary, it is intended to include all alternatives, modifications, and equivalents as can be included within the spirit and scope of the following claims.

What is claimed is:

1. A semiconductor memory device, comprising:
    a data memory unit having a plurality of memory blocks;
    a rewriting monitor circuit for memorizing the number of times of data rewriting in each of the memory blocks, the rewriting monitor circuit being a nonvolatile memory device;
    a block address switching circuit for switching a block selection address;
    a temporary memory circuit for temporarily retaining data memorized in a predetermined block;
    a control unit for controlling a data transfer; and a rewriting inhibition information memory circuit for memorizing rewriting inhibition information on each of the memory blocks.

2. The semiconductor memory device according to claim 1, wherein the block address switching circuit includes:
    a block address memory unit for memorizing correspondence information between each of the memory blocks and an external block address signal outputted from the control unit; and
    a conversion circuit for converting an address.

3. The semiconductor memory device according to claim 2, wherein the conversion circuit includes a switching circuit and a control circuit for controlling the switching circuit based on the correspondence information.

4. The semiconductor memory device according to claim 1, wherein the data memory unit is a nonvolatile memory device.

5. The semiconductor memory device according to claim 1, wherein the semiconductor memory device is formed in one chip.

6. A method of controlling a semiconductor memory device, comprising the steps of:
    erasing data in a first memory block based on a rewriting request;
    acquiring the number of times of rewriting in each memory block;
    writing, to a temporary memory circuit, data in a second memory block in which the number of times of rewriting is equal to a predetermined value or less, when the number of times of rewriting in the first memory block, in which the data is erased, exceeds the predetermined value;
    erasing the data in the second memory block;
    changing a memory block address to memorize it;
    transferring the data stored in the temporary memory circuit to the first memory block; and
    writing data to be rewritten to the second memory block.

7. The method according to claim 6, wherein the second memory block is a block in which the number of times of rewriting is smallest.

8. The method according to claim 6, further comprising the step of:
    increasing the number of times of rewriting in a memory block by one while erasing data in the memory block.

9. The method according to claim 6, further comprising the step of:
    memorizing rewiring inhibition information on a memory block in which the number of times of rewriting has exceeded a predetermined value.

* * * * *